(12) United States Patent
Jones et al.

(10) Patent No.: US 8,624,658 B1
(45) Date of Patent: Jan. 7, 2014

(54) FREQUENCY MIXER HAVING PARALLEL MIXER CORES

(75) Inventors: Theron L. Jones, White Heath, IL (US);
Richard D. Davis, Champaign, IL (US);
James Imbornone, Methuen, MA (US);
Xuejin Wang, Fort Collins, CO (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 13/561,529

(22) Filed: Jul. 30, 2012

(51) Int. Cl.
*G01V 3/02* (2006.01)

(52) U.S. Cl.
USPC .......................................... 327/355; 455/323

(58) Field of Classification Search
USPC ........................... 327/355–361; 455/323, 326
See application file for complete search history.

(56) References Cited

U.S. PATENT DOCUMENTS

| | | | |
|---|---|---|---|
| 6,807,407 B2 * | 10/2004 | Ji | 455/326 |
| 7,205,817 B1 | 4/2007 | Huang | |
| 7,880,547 B2 * | 2/2011 | Lee et al. | 330/295 |
| 8,107,906 B2 * | 1/2012 | Lum et al. | 455/137 |
| 8,422,967 B2 * | 4/2013 | Rofougaran et al. | 455/127.1 |

* cited by examiner

Primary Examiner — Dinh T. Le
(74) Attorney, Agent, or Firm — Advent, LLP

(57) ABSTRACT

A frequency mixer having parallel mixer cores is described that is configured to heterodyne a signal. In an implementation, the frequency mixer includes a first mixer core and a second mixer core. A first balun is connected to the first mixer core and configured to furnish a LO signal occurring in a first range of frequencies to the first mixer core. The mixer includes a second balun coupled to the second mixer core, and the second balun is configured to furnish a LO signal occurring in a second range of frequencies during a second time interval. The mixer includes a first biasing voltage source that is center tapped to the first balun and a second biasing voltage source is center tapped to the second balun to further prevent operation of the at least substantially non-operational mixer core.

9 Claims, 5 Drawing Sheets

FREQUENCY MIXER HAVING PARALLEL MIXER CORES

BACKGROUND

It is often desirable to convert frequencies of a signal from a first frequency band to a second frequency band, especially in radio frequency (RF) systems, such as in cellular applications (e.g., cellular basestations). For example, frequency conversion is typically utilized to allow for the amplification, filtration, and data conversion of a received signal at a frequency other than the RF frequency. Thus, frequency mixers are typically utilized in these RF systems for frequency conversion. Frequency mixers include electrical circuits configured to create new frequencies from two signals applied to the frequency mixer. For example, frequency mixers may be utilized to shift signals from one frequency range to another (e.g., heterodyning the signals).

SUMMARY

A frequency mixer having parallel mixer cores is described that is configured to heterodyne a signal. In one or more implementations, the frequency mixer includes a first mixer core that is connected to a radio frequency (RF) port and an intermediate frequency (IF) port. The frequency mixer also includes a second mixer core that is connected to the RF port and the IF port. A first local oscillator (LO) balun is connected to the first mixer core and configured to furnish an LO signal occurring in a first limited range of frequencies to the first mixer core during a first time interval. The frequency mixer also includes a second LO balun coupled to the second mixer core. The second LO balun is configured to furnish an LO signal occurring in a second limited range of frequencies to the second mixer core during a second timer interval. The frequency mixer also includes a first biasing voltage source that is center tapped to the first LO balun. The first biasing voltage source is configured to furnish a negative direct current (DC) voltage to the first mixer core when the first mixer core is at least substantially non-operational to further prevent operation of the first mixer core during the second time interval. A second biasing voltage source is center tapped to the second LO balun. The second biasing voltage source is configured to furnish the negative DC voltage to the second mixer core when the second mixer core is at least substantially non-operational to further prevent operation of the second mixer core during the first time interval.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
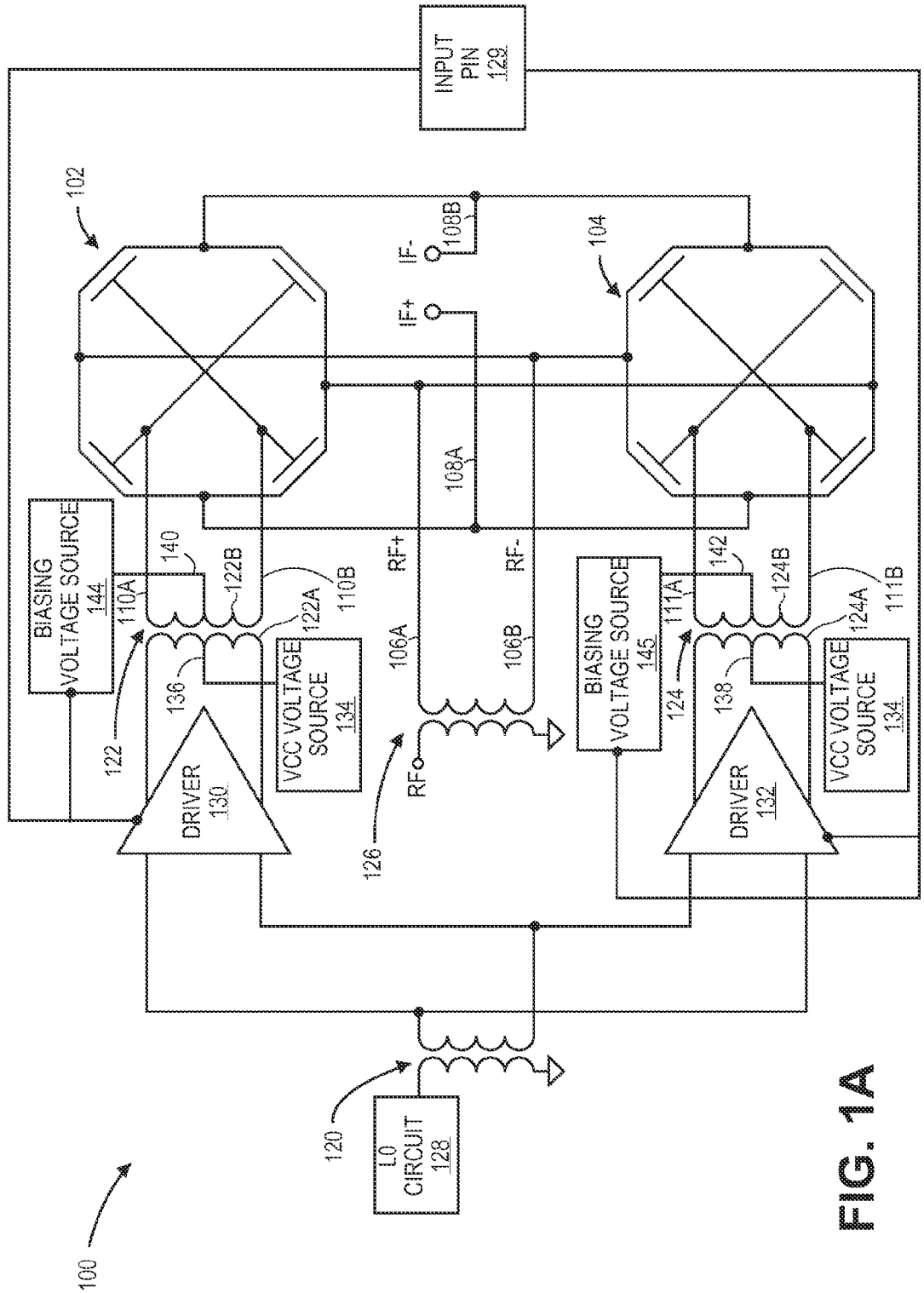
FIG. 1A is a schematic diagram illustrating a frequency mixer having parallel cores in accordance with an example implementation of the present disclosure.

Mixer circuits are commonly used in a number of applications. For example, mixer circuits are often used in radio frequency (RF) applications for up-converting (up-mixing) or down-converting (down-mixing). In this context, up-converting is the process of mixing a base band signal or IF signal, such as a differential IF signal, with an LO signal, such as a differential LO signal, that is generated by a local oscillator circuit that operates in the RF range. This process generates a mixed RF signal with the IF information included with (mixed with) the LO signal generated by the local oscillator. Down-converting is the process of mixing an RF signal, such as a differential RF signal, with an LO signal, such as a differential LO signal, that is generated by a local oscillator circuit that operates in the RF range. This process generates a mixed IF (or baseband) signal with the RF information included with (e.g., mixed with) the LO signal generated by the local oscillator.

A typical type of mixer circuit includes a passive mixer circuit, which may be implemented using complementary-metal-oxide semiconductor (CMOS) circuit fabrication processes. In such circuits, the operation of such mixer circuits is dependent on the linear range of those circuits. Thus, the linear range of the circuit affects the one decibel (1 dB) compression point and the third intercept point (IP3), which are measures of the adverse affects of non-linearities on the gain and performance of such circuits. In this respect, current approaches for implementing passive mixer circuits have certain limitations. These limitations include limited linear ranges, which result in 1 dB compression points and IP3 points that are unacceptable for RF and IF signals with higher amplitudes (e.g. high signal swings).

Accordingly, a frequency mixer is described that extends the range (e.g., signal swing) of the RF and IF signals while preventing degradation of the 1 dB metric for wideband, high-linearity multi-core mixers. In one or more implementations, the frequency mixer includes parallel mixer cores. The parallel mixer cores include a first mixer core that is connected to a radio frequency (RF) port and an intermediate frequency (IF) port as well as a second mixer core that is connected to the RF port and the IF port. A first local oscillator (LO) balun is connected to the first mixer core and configured to furnish an LO signal occurring in a first limited range of frequencies to the first mixer core during a first time interval. The frequency mixer also includes a second LO balun coupled to the second mixer core. The second LO balun is configured to furnish an LO signal occurring in a second limited range of frequencies to the second mixer core during a second time interval. The frequency mixer also includes a first biasing voltage source that is center tapped to the first LO balun. The first biasing voltage source is configured to furnish a negative direct current (DC) voltage to the first mixer core when the first mixer core is at least substantially non-operational to further prevent operation of the first mixer core during the second time interval. A second biasing voltage source is center tapped to the second LO balun. The second biasing voltage source is configured to furnish the negative DC voltage to the second mixer core when the second mixer core is at least substantially non-operational to further prevent operation of the second mixer core during the first time interval. It is understood that this application may be extended to N parallel cores, where N is the number of parallel cores.

Example Frequency Mixers

FIGS. 1A through 1E illustrate a frequency mixer 100 in accordance with example implementations of the present disclosure. As shown, the frequency mixer 100 is a passive mixer configured to generate signals having new frequencies from a plurality of signals applied to the frequency mixer 100. For example, the mixer 100 may be configured to perform up-conversion to an input signal such that the frequency of the output signal is higher from the frequency of the input signal. In another example, the mixer 100 may be configured to perform down-conversion of the input signal such that the frequency of the output signal is lower from the frequency of the input signal. Up-conversion mixers are typically utilized in transmitters, and down-conversion mixers are typically utilized in receivers. For example, up-converting includes the process of mixing a base band signal or IF signal, such as a differential IF signal, with an LO signal, such as a differential LO signal, that is generated by a local oscillator circuit that operates in the RF range. In another example, down-converting is the process of mixing an RF signal, such as a differential RF signal, with an LO signal, such as a differential LO signal, that is generated by a local oscillator circuit that operates in the RF range.

Figure 1B:
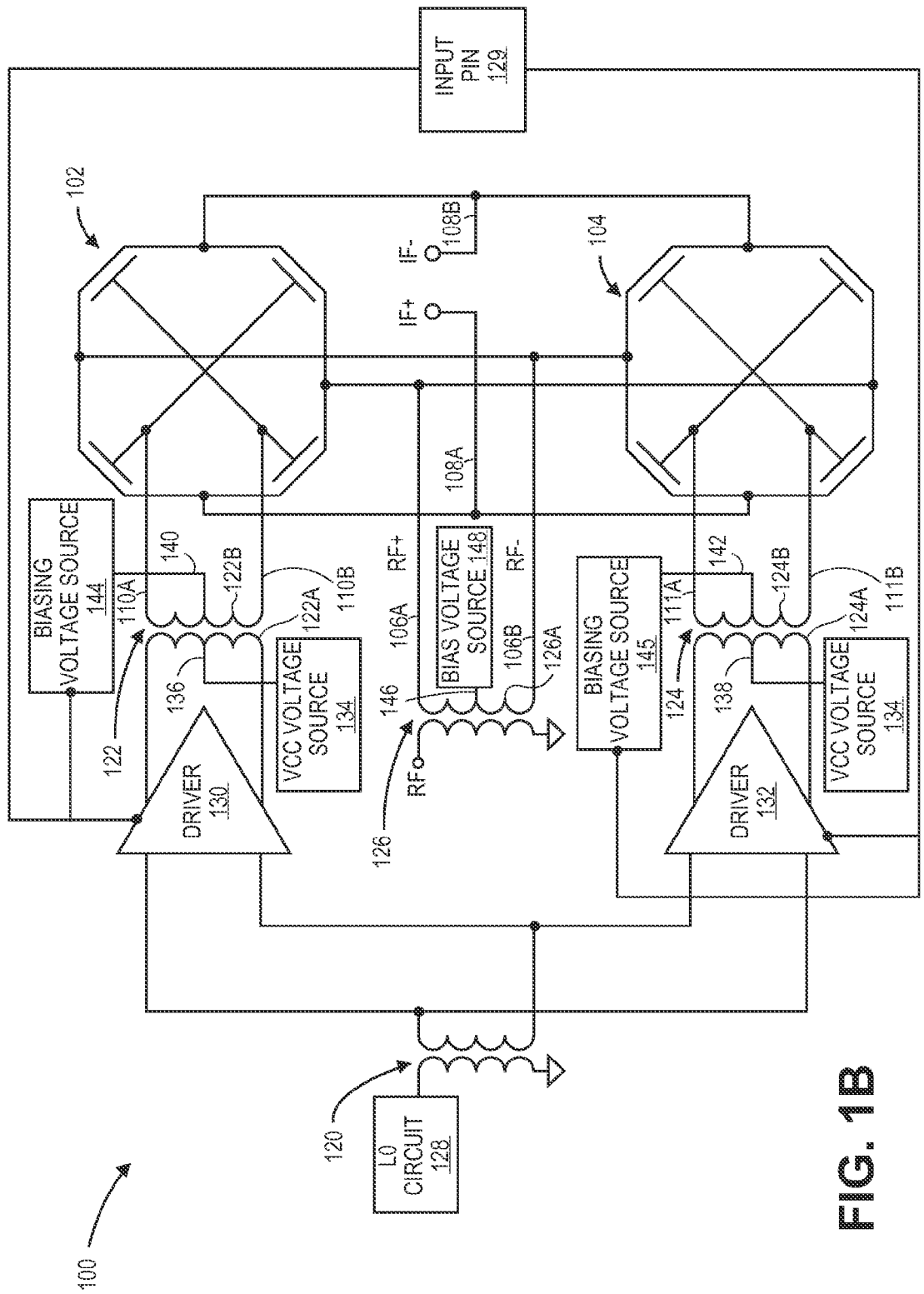
FIG. 1B is a schematic diagram illustrating a frequency mixer having parallel cores in accordance with an example implementation of the present disclosure.
Figure 1C:
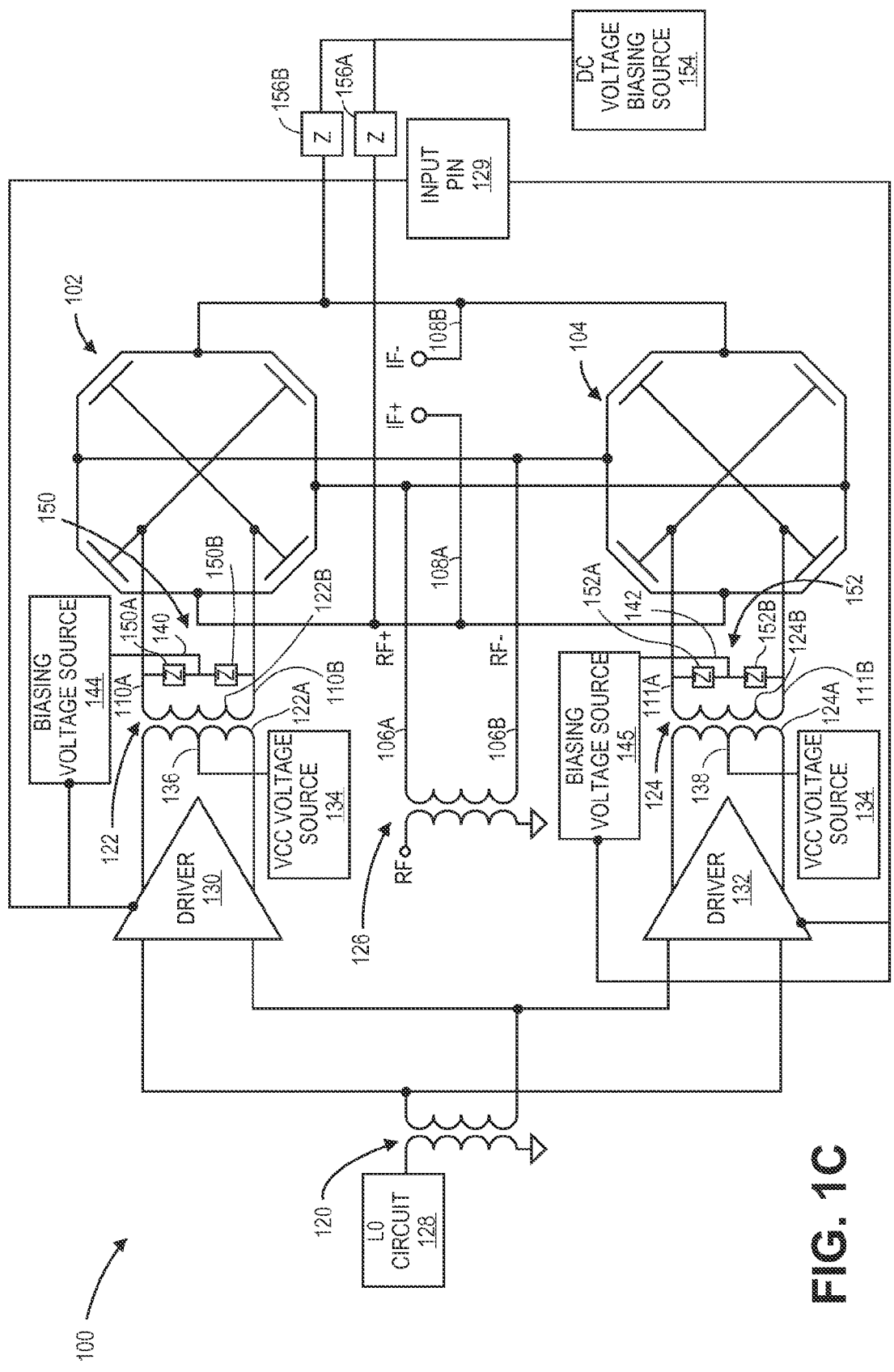
FIG. 1C is a schematic diagram illustrating a frequency mixer having parallel cores in accordance with an example implementation of the present disclosure

As illustrated in FIGS. 1A through 1C, the frequency mixer 100 illustrated includes at least two parallel mixer cores 102, 104. The mixer cores 102, 104 are coupled to two sets of differential ports (e.g., terminals) 106, 108. As shown, the frequency mixer 100 includes differential radio frequency (RF) ports 106A (RF+), 106B (RF−) and differential intermediate frequency (IF) ports 108A (IF+), 108B (IF−). The frequency mixer 100 also includes local oscillator (LO) ports 110, 111 (110A [LO+], 110B [LO−], 111A [LO+], 111B [LO−]) that are configured to facilitate conversion of signals furnished to the mixer 100. As shown, the LO ports 110A, 110B are associated with the first mixer core 102, and the LO ports 111A, 111B are associated with the second mixer core 104. In an implementation, the LO portions 110A, 110B, 111A, 111B are utilized to furnish a differential LO signal to the gates of the respective transistors. The LO signal includes waveform characteristics occurring within the RF range. The RF ports 106A, 106B, the IF ports 108A, 108B, and the LO ports 110A, 110B are common to the first mixer core 102, and the RF ports 106A, 106B, the IF ports 108A, 108B, and the LO ports 111A, 111B are common to the second mixer core 104.

Figure 1D:
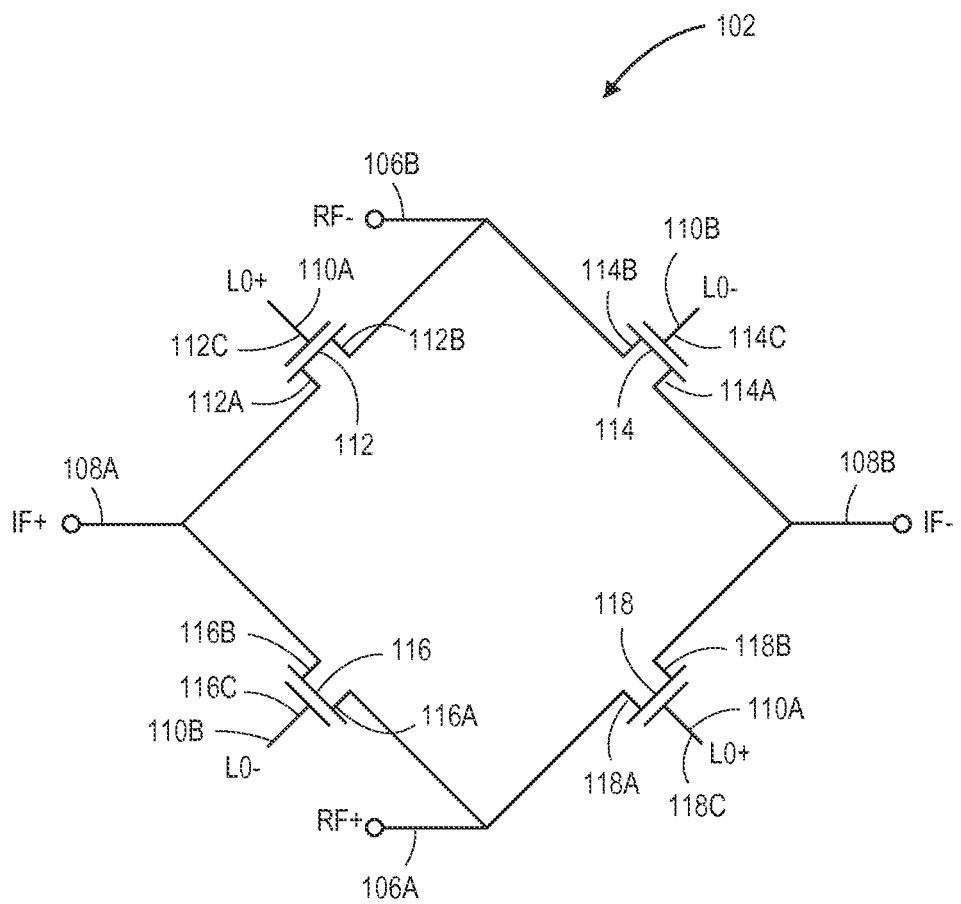
FIGS. 1D and 1E are a circuit diagrams illustrating example implementations of the mixer cores shown in FIGS. 1A and 1B, wherein the mixer cores are implemented in a quad field-effect-transistor (FET) ring configuration.
Figure 1E:
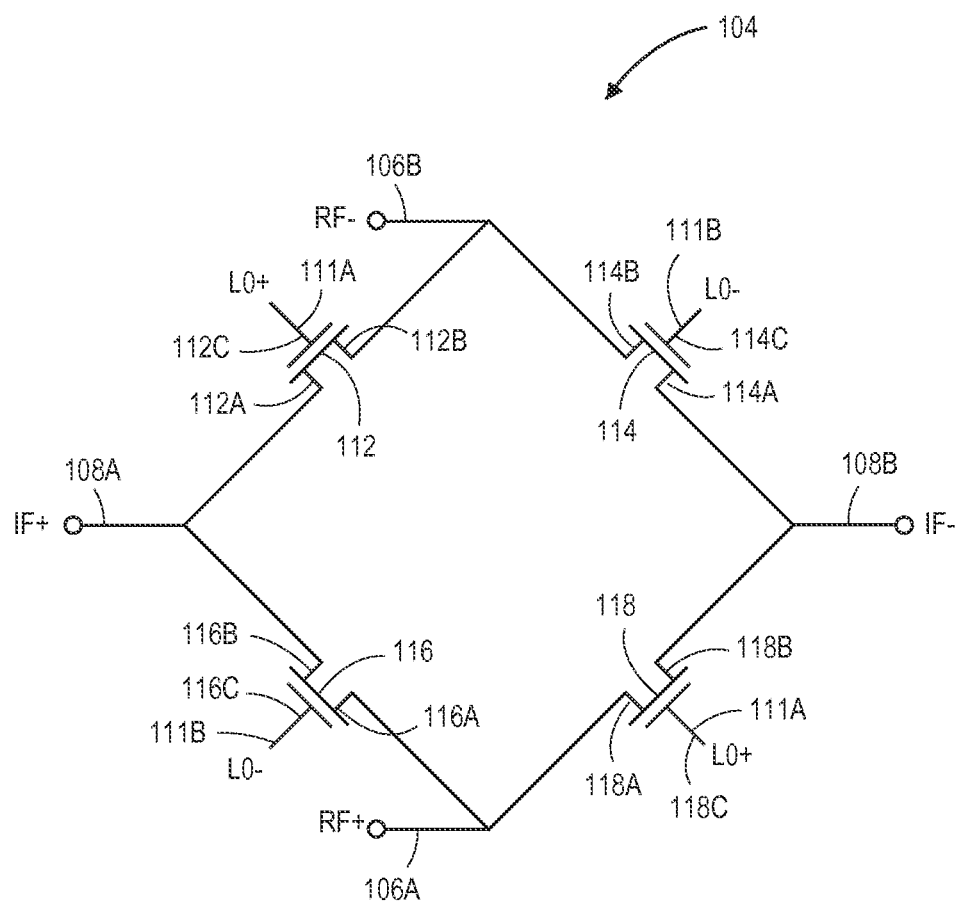

FIGS. 1D and 1E illustrate example implementations of mixer cores 102, 104. Each mixer core 102, 104 may comprise a quad FET ring mixer core that includes four transmission gates 112, 114, 116, 118 arranged in a ring configuration (see FIG. 1B). In one or more implementations, the transmission gates 112, 114, 116, 118 may be metal-oxide-semiconductor field-effect transistors (MOSFETs). For example, each transmission gate (transistor) 112, 114, 116, 118 may be an n-type MOSFET device. In another example, each transistor 112, 114, 116, 118 may be a p-type MOSFET device. The transistors 112, 114, 116, 118 each include a source contact (e.g., electrode), a drain contact, and a gate contact, which provide an electrical connection to the respective regions (e.g., source region, drain region, gate) of each transistor.

Thus, the transistor 112 includes a source contact 112A, a drain contact 112B, and a gate contact 112C; the transistor 114 includes a source contact 114A, a drain contact 114B, and a gate contact 114C; the transistor 116 includes a source contact 116A, a drain contact 116B, and a gate contact 116C; and the transistor 118 includes a source contact 118A, a drain contact 118B, and a gate contact 118C. The transistors 112, 114, 116, 118 each have an open configuration (e.g., open circuit to prevent current flow) and a closed configuration (e.g., closed circuit to allow current flow).

For the purposes of the present disclosure, source and drain contacts are described using the reference numbers 112A, 112B, 114A, 114B, 116A, 116B, 118A, 118B. While these example source and drain contacts are shown in a specific configuration, it will be appreciated that other configurations may be used (e.g., configurations where one or more source and drain regions are interchangeable in implementations of the frequency mixer 100). In a specific implementation of the frequency mixer 100, the quad FET ring mixer includes the drain contact 112B of the first transistor 112 and the drain contact 114B of the second transistor 114 are connected together (e.g., in communication) via an electrical connection (e.g., a wire trace, and so forth), which is connected to the RF port 106B (RF−). The quad FET ring mixer also includes the source contact 112A of the first transistor 112 and the drain contact 116B of the third transistor 116 are connected together via an electrical connection, which is connected to the IF port 108A (IF+). The source contact 116A of the third transistor 116 and the source contact 118A of the fourth transistor 118 are communicatively connected together via an electrical connection, which is connected to the RF port 106A (RF+). The source contact 114A of the second transistor 114 and the drain contact 118B of the fourth transistor 118 are communicatively connected together via an electrical connection, which is connected to the IF port 108B (IF−). The gate contact 112C of the first transistor 112 and the gate contact 118C of the fourth transistor 118 are each communicatively connected to the LO port 110A (LO+) of the first mixer core 102 (and are communicatively connected to the LO port 111A (LO+) within the second mixer core 104). The gate contact 114C of the second transistor 114 and the gate contact 116C of the third transistor 116 are communicatively connected to the LO port 110B (LO−) of the first mixer core 102 (and communicatively connected to the LO port 111B (LO−) within the second mixer core 104).

In an implementation, when the alternating current (AC) voltage at the LO port 110A furnishes a sufficient voltage to the respective gate contacts 112C, 118C, the respective transistors 112, 118 transition from the open configuration to the closed configuration to allow for current flow and transistors 114, 116 transition from the closed configuration to the open configuration due to the differential nature of the LO signal. While the transistors 112, 118 are in the closed configuration, the RF port 106B (RF−) is communicatively connected to the IF port 108A (IF+). Additionally, while the transistors 112, 118 are in the closed configuration, the RF port 106A (RF+) is also communicatively connected to the IF port 108B (IF−). Thus, the signal present at the RF port 106B may pass through to the IF port 108A, and vice versa. Additionally, the signal present at the RF port 106A may pass through to the IF port 108B, and vice versa. During this portion of the LO cycle, the transistors 114, 116 are in the open configuration, and when the LO AC voltage inverts the LO port 110B furnishes a sufficient voltage to the respective gate contacts 114C, 116C, the respective transistors 114, 116 transition from the open configuration to the closed configuration to allow for current flow. While the transistors 114, 116 are in the closed configuration, the RF port 106B (RF−) is communicatively connected to the IF port 108B (IF−). Additionally, while the transistors 114, 116 are in the closed configuration, the RF port 106A (RF+) is communicatively connected to the IF port 108A (IF+). Thus, the signal present at the RF port 106A may pass through to the IF port 108A, and vice versa. Additionally, the signal present at the RF port 106B may pass through to the IF port 108B, and vice versa. During this portion of the LO cycle, the transistors 112, 118 are in the open configuration. Thus, the differential AC signal at the LO ports 110,111 commutates the connections between the differential RF and IF ports (e.g., ports 106A, 106B, 108A, 108B).

As shown in FIGS. 1A through 1C, the frequency mixer 100 includes a first balanced-unbalanced device (balun) 120, a second balun 122, a third balun 124, and a fourth balun 126. In an implementation, the baluns 120, 122, 124, 126 comprise a transformer coupled to various ports and/or circuitry configured to facilitate transmission of various RF signals (e.g., differential LO signals, differential RF signals). For example, the first balun 120 is coupled to a LO signal circuit 128 that is configured to furnish the LO signal. In implementations, the LO signal is a radio frequency (RF) signal communicated to the first balun 120 via the LO signal circuit 128. As shown, the first balun 120 is coupled to a first driver 130 and a second driver 132. The first driver 130 is connected to the second balun 122, and the second driver 132 is connected to the third balun 124. The drivers 130, 132 are configured to amplify the LO signal before furnishing the amplified LO signal to the respective baluns 122, 124. For instance, the driver 130 furnishes an amplified LO signal to the second balun 122, and the driver 132 furnishes an amplified LO signal to the third balun 124. The second balun 122 and the third balun 124 are connected to a $V_{CC}$ voltage source 134 via respective center taps 136, 138 at the primary winding portion 122A, 124A of the baluns 122, 124 (see FIGS. 1A through 1C). In an implementation, the $V_{CC}$ voltage source 134 is a DC bias utilized to furnish a DC voltage to bias (and at least partially power) the respective drivers 130, 132 (e.g., the center tap 136 is associated with the first driver 130; the center tap 138 is associated with the second driver 132). For example, the $V_{CC}$ voltage source 134 is configured to furnish a DC voltage to the primary winding portion 122A of the balun 122 during the first time interval, and the $V_{CC}$ voltage source 134 is configured to furnish a DC voltage to the primary winding portion 124A of the balun 124 during the second time interval.

In one or more implementations, the mixer 100 allows operation in two or more separate LO frequency bands. Thus, the LO signal circuit 128 is configured to furnish a LO signal to the first balun 120 occurring in a first frequency band (RF signal having a first limited range of frequencies) and to furnish a LO signal to the first balun 120 occurring in a second frequency band (RF signal having a second limited range of frequencies). In an implementation, an input pin 129 is configured to selectively activate and/or deactivate the mixer cores 102, 104 by alternately powering the drivers 130, 132. For example, when the LO signal is occurring in the first frequency band, the input pin 129 is configured to enable operation of the first mixer core 102 by sufficiently powering the driver 130 (and not powering the second driver 132), and when the LO signal is occurring in the second frequency band, the input pin 129 is configured to enable operation of the second mixer core 104 by sufficiently power the driver 132 (and not powering the first driver 130). In an implementation, the input pin 129 may comprise control circuitry configured to selectively (e.g., alternately) power the drivers 130, 132 as a function of the frequency band of the signal.

A high signal swing at the IF ports (108A, 108B) or the RF ports (106A, 106B) may cause the gate-to-source voltage ($V_{GS}$) to attain a greater positive voltage as compared to the threshold voltage ($V_T$) of the respective transistor ($V_{GS} > V_T$ when the LO signal at the gates of the transistors is approximately zero volts (0V)), which causes the at least substantially inoperative mixer core 102, 104 to become at least partially enabled (where conduction occurs between the source and the drain of the respective transistor). This may lead to a degraded P 1 dB (output power at one (1) decibel (dB) compression point) as compared to mixer cores (e.g., mixer cores 102, 104) having a completely inoperative mixer core and greater signal distortion at high signal levels. For example, an RF signal having a high signal swing may occur in a range of at least approximately one and a half gigahertz to at least approximately three gigahertz (1.5-3 GHz) at the drain and source regions of the transistors of the at least substantially inoperative mixer core may cause the transistors of the at least substantially inoperative mixer core to become at least partially operational during a portion (e.g., negative peak or trough) of the RF cycle. In another example, the RF signal range may be at least approximately one thousand six hundred and fifty megahertz to at least approximately two thousand eight hundred and fifty (1,650-2,850 MHz), with an RF signal breakpoint of at least approximately two gigahertz (2 GHz) separating the band of operation between the mixer cores 102, 104. Thus, the LO signal may include a negative direct current (DC) voltage to furnish an additional negative voltage to the gates of the transistors, which serves to reduce the possibility that the transistors of the at least substantially inoperative mixer core 102, 104 become at least partially operational (at least partially enabled) during high RF or IF signal swings, which is described in greater detail below. Thus, the additional negative voltage applied to the gates of the transistors of the disabled mixer core 102, 104 serves to require a greater negative voltage to be applied to the RF port 106, or the IF port 108, of the source and/or drain regions before the transistor becomes conductive.

In an implementation, as shown in FIG. 1A, the secondary windings 122B, 124B of the second balun 122 and the third baluns 124 are connected to a respective biasing voltage source 144, 145 configured to furnish a DC bias voltage to the LO signal. In a specific implementation, the biasing voltage source is a positive or negative threshold voltage ($+/-V_T$) source configured to furnish a voltage at least approximately equal to $+/-V_T$ of the transistors 112, 114, 116, 118 via center taps 140, 142. For example, the center taps 140, 142 are connected to a first and a second biasing voltage source 144, 145 (e.g., $V_T$ voltage source), respectively. The biasing voltage source 144, 145 are configured to furnish the proper $V_T$ voltage to the center taps 140, 142, respectively. In other implementations, the DC biasing voltage source 144, 145 powering the at least substantially non-operational mixer core may furnish a voltage ranging from at least approximately seventy percent to at least approximately ninety percent (70%-90%) of a negative $(-)V_T$ of the transistors 112, 114, 116, 118. However, it is understood that more negative voltages may be desirable. For example, when the first mixer core 102 is enabled, or operational, (and the second mixer core 104 is at least substantially disabled, or at least substantially non-operational) the $V_T$ furnished to the center tap 140 is at least approximately a positive $V_T$ voltage, and the $V_T$ furnished to the center tap 142 is an at least a substantially negative $V_T$ voltage. In another example, when the second mixer core 104 is enabled (and the first mixer core 102 is at least substantially disabled) the $V_T$ voltage furnished to the center tap 142 is an at least approximately positive $(+)$ $V_T$ voltage, and the $V_T$ voltage furnished to the center tap 140 is an at least substantially negative (−) $V_T$ voltage. The positive (+) $V_T$ voltage serves to function as a center DC voltage for which the LO signal is centered about, which may generate an at least approximately fifty percent (50%) duty cycle for the enabled (on) mixer switching. As described above, the negative (−)$V_T$ voltage serves to assist in preventing the inoperative mixer core transistors from becoming at least partially enabled.

In another implementation, the frequency mixer 100 may not include the negative biasing voltages to the at least substantially disabled mixer core center taps 140, 142. In this implementation, as shown in FIG. 1B, a positive DC bias voltage may be applied directly to the RF signal. As shown in FIG. 1B, the RF signal is furnished to the frequency mixer 100 via the RF (fourth) balun 126. In an implementation, the secondary winding 126A of the RF balun 126 may be connected to a center tap 146, which is connected to a positive DC biasing voltage source ($V_{AC}$) 148. Thus, the $V_{AC}$ voltage may sufficiently bias the RF signal such that the signal swings do not cause conduction between the respective source and drain regions of the at least substantially disabled transistors (of the at least substantially disabled mixer core). The $V_{AC}$ voltage may be approximately equal to the $V_T$ of the transistors 112, 114, 116, 118.

In another implementation, as shown in FIG. 1C, the biasing voltage sources 144, 145 may be each coupled to respective differential impedance feeds 150, 152. As shown, the first differential impedance feed 150 is coupled to the balun 122, and the second differential impedance feed 152 is coupled to the balun 124. The biasing voltage sources 144, 145 are configured to furnish a negative DC bias voltage to the respective differential impedance feed 150, 152, which furnishes a negative DC bias voltage to the respective balun 122, 124. For example, the biasing voltage source 144 is configured to furnish a negative DC bias voltage to the first differential impedance feed 150 when the first mixer core 102 is at least substantially inoperative (the first differential impedance feed 150 is configured to furnish a negative DC bias voltage to the balun 122). The biasing voltage source 145 is configured to furnish a negative DC bias voltage to the second differential impedance feed 152 when the second mixer core 104 is at least substantially inoperative (the second differential impedance feed 152 is configured to furnish a negative DC bias voltage to the balun 124). In one or more implementations, the differential impedance feeds 150, 152 comprise impedance components 150A, 150B and impedance components 152A, 152B, respectively. The impedance components 150A, 150B, 152A, 152B may comprise resistive components, inductive components, combinations thereof, or the like.

The frequency mixer 100 may also include a DC biasing voltage source 154 that is connected to the IF ports 108A, 108B. The DC biasing voltage source 154 is configured to furnish a positive DC voltage to the IF ports 108A, 108B. As shown, the DC biasing voltage source 154 is connected to an impedance component 156A, and the impedance component 156A is connected to the IF port 108A. The DC biasing voltage source 154 is also connected to an impedance component 156B, and the impedance component 156B is connected to the IF port 108B.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A frequency mixer comprising:
    a first mixer core coupled to a radio frequency (RF) port and an intermediate frequency (IF) port;
    a second mixer core coupled to the RF port and the IF port;
    a first local oscillator (LO) balun coupled to the first mixer core, the first LO balun configured to furnish a first LO signal to the first mixer core during a first time interval;
    a second LO balun coupled to the second mixer core, the second LO balun configured to furnish a second LO signal to the second mixer core during a second time interval, the first time interval different than the second time interval;
    a first biasing voltage source electrically connected to the first LO balun, the first biasing voltage source configured to furnish a negative direct current (DC) voltage to the first mixer core when the first mixer core is at least substantially non-operational;
    a second biasing voltage source electrically connected to the second LO balun, the second biasing voltage source configured to furnish the negative DC voltage to the second mixer core when the second mixer core is at least substantially non-operational;
    a first driver coupled to the first LO balun, the first driver configured to amplify the first LO signal during the first time interval;
    a second driver coupled to the second LO balun, the second driver configured to amplify the second LO signal during the second time interval; and
    control circuitry operatively coupled to the first driver, the second driver, the first biasing voltage source the second biasing voltage source, the control circuitry configured to selectively power the first driver during the first time interval and to selectively power the second driver during the second time interval, the control circuitry configured to cause the first biasing voltage source to furnish a negative direct current (DC) voltage to the first mixer core when the first mixer core is at least substantially non-operational and to cause the second biasing voltage source to furnish the negative DC voltage to the second mixer core when the second mixer core is at least substantially non-operational.

2. The frequency mixer as recited in claim 1, wherein the first biasing voltage source is electrically connected to the first LO balun via a center tap connection and the second biasing voltage source is electrically connected to the second LO balun via a center tap connection.

3. The frequency mixer as recited in claim 1, wherein the first biasing voltage source is connected to a first differential impedance feed, the first differential impedance feed connected to the first LO balun, the first biasing voltage source configured to furnish a negative voltage to the first differential impedance feed when the first mixer core is at least substantially non-operational, wherein the second biasing voltage source is connected to a second differential impedance feed, the second differential impedance feed connected to the second LO balun, the second biasing voltage source configured to furnish a negative voltage to the second differential impedance feed when the second mixer core is at least substantially non-operational.

4. The frequency mixer as recited in claim 1, further comprising a positive direct current (DC) biasing voltage source coupled to IF ports, the DC biasing voltage source configured to furnish a positive DC voltage to the IF ports.

5. The frequency mixer as recited in claim 1, wherein the first LO balun and the second LO balun include a primary winding portion and a secondary winding portion, wherein a first biasing voltage source is electrically connected to the primary winding portion of the first LO balun and the second LO balun, the first biasing voltage source configured to furnish a DC voltage for powering the first driver during the first time interval and for powering the second driver during the second time interval, wherein a second biasing voltage source is electrically connected to the secondary winding portion of the first LO balun, the second biasing voltage source configured to furnish a negative voltage to prevent operation of the first mixer core during the second time interval, and wherein a third biasing voltage source center is electrically connected to the secondary winding portion of the second LO balun, the third biasing voltage source configured to furnish a negative voltage to prevent operation of the second mixer core during the first time interval.

6. A frequency mixer comprising:
- a first mixer core coupled to a radio frequency (RF) port and an intermediate frequency (IF) port;
- a second mixer core coupled to the RF port and the IF port;
- a first local oscillator (LO) balun coupled to the first mixer core, the first LO balun configured to furnish a first LO signal to the first mixer core during a first time interval;
- a second LO balun coupled to the second mixer core, the second LO balun configured to furnish a second LO signal to the second mixer core during a second time interval, the first time interval different than the second time interval;
- a RF balun coupled to the RF port, the RF balun configured to furnish a RF signal to the RF port;
- a biasing voltage source electrically connected to the RF balun, the biasing voltage source configured to furnish a positive DC voltage to bias the RF signal about the positive DC voltage to disable the second mixer core when the first mixer core is enabled and to disable the first mixer core when the second mixer core is disabled;
- a first driver coupled to the first LO balun, the first driver configured to amplify the first LO signal during the first time interval;
- a second driver coupled to the second LO balun, the second driver configured to amplify the second LO signal during the second time interval; and
- control circuitry operatively coupled to the biasing voltage source, the first driver, and the second driver, the control circuitry configured to selectively power the first driver during the first time interval and to selectively power the second driver during the second time interval, the control circuitry configured to cause the biasing voltage source to furnish a positive DC voltage to bias the RF signal about the positive DC voltage to disable the second mixer core when the first mixer core is enabled and to disable the first mixer core when the second mixer core is disabled.

7. The frequency mixer as recited in claim 6, wherein at least one core mixer includes a metal-oxide-semiconductor field-effect transistor (MOSFET) device.

8. The frequency mixer as recited in claim 7, wherein a positive DC voltage is at least approximately equal to a threshold voltage of the MOSFET device.

9. The frequency mixer as recited in claim 6, wherein the first LO balun and the second LO balun include a primary winding portion and a secondary winding portion, wherein a first biasing voltage source is electrically connected to the primary winding portion of the first LO balun and the second LO balun, the first biasing voltage source configured to furnish a DC voltage for powering the first driver during the first time interval and for powering the second driver during the second time interval, wherein a second biasing voltage source is electrically connected to the secondary winding portion of the first LO balun, the second biasing voltage source configured to furnish a negative voltage to prevent operation of the first mixer core during the second time interval, and wherein a third biasing voltage source center is electrically connected to the secondary winding portion of the second LO balun, the third biasing voltage source configured to furnish a negative voltage to prevent operation of the second mixer core during the first time interval.

\* \* \* \* \*